(12) United States Patent
Arai et al.

(10) Patent No.: US 7,884,381 B2
(45) Date of Patent: Feb. 8, 2011

(54) LIGHT EMITTING DEVICE AND METHOD FOR FABRICATING THE SAME INCLUDING A BACK SURFACE ELECTRODE WITH AN AU ALLOY

(75) Inventors: Masahiro Arai, Hitachi (JP); Kazuyuki Iizuka, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 0 days.

(21) Appl. No.: 12/461,008

(22) Filed: Jul. 29, 2009

(65) Prior Publication Data

US 2010/0065869 A1    Mar. 18, 2010

(30) Foreign Application Priority Data

Sep. 12, 2008    (JP)    ............................ 2008-234745

(51) Int. Cl.
| | |
|---|---|
| H01L 29/06 | (2006.01) |
| H01L 31/0328 | (2006.01) |
| H01L 31/0336 | (2006.01) |
| H01L 31/072 | (2006.01) |
| H01L 31/109 | (2006.01) |
| H01L 27/15 | (2006.01) |
| H01L 29/26 | (2006.01) |
| H01L 31/12 | (2006.01) |
| H01L 33/00 | (2006.01) |
| H01L 29/22 | (2006.01) |
| H01L 29/227 | (2006.01) |
| H01L 29/24 | (2006.01) |

(52) U.S. Cl. .............................. 257/94; 257/13; 257/79; 257/98; 257/103; 257/E33.001; 257/E33.016; 257/E33.068

(58) Field of Classification Search .................... 257/13, 257/79, 94, 98, 103, E33.001, E33.016, E33.068
See application file for complete search history.

(56) References Cited

U.S. PATENT DOCUMENTS 6,469,324 B1 * 10/2002 Wang .......................... 257/98

(Continued)

FOREIGN PATENT DOCUMENTS

JP    2005-175462    6/2005

*Primary Examiner*—Ida M Soward
(74) *Attorney, Agent, or Firm*—McGinn Intellectual Property Law Group, PLLC

(57) ABSTRACT

A light emitting device includes a semiconductor multilayer structure having a first semiconductor layer of a first conductivity type, a second semiconductor layer of a second conductivity type, and an active layer. A reflecting layer is provided at a side of one surface of the semiconductor multilayer structure and reflects a light emitted from the active layer. A supporting substrate of Si or Ge is provided at an opposite side of the reflecting layer with respect to the side of the semiconductor multilayer structure and supports the semiconductor multilayer structure via a metal bonding layer. A back surface electrode is provided at an opposite side of the supporting substrate with respect to a side of the metal bonding layer and includes Au alloyed with the support substrate. A hardness of the back surface electrode is higher than a hardness of the Au.

13 Claims, 12 Drawing Sheets

U.S. PATENT DOCUMENTS

| | | | |
|---|---|---|---|
| 6,529,308 B2 * | 3/2003 | Beteille et al. | 359/265 |
| 6,570,191 B2 * | 5/2003 | Mizuno et al. | 257/98 |
| 7,029,767 B2 * | 4/2006 | Nakamata | 428/690 |
| 7,151,506 B2 * | 12/2006 | Knowles et al. | 343/909 |
| 7,439,551 B2 * | 10/2008 | Hata | 257/98 |
| 7,453,098 B2 * | 11/2008 | Lai et al. | 257/98 |
| 7,459,727 B2 * | 12/2008 | Stauss | 257/89 |
| 7,554,124 B2 * | 6/2009 | Hata | 257/79 |
| 7,598,530 B2 * | 10/2009 | Chu | 257/90 |
| 7,602,829 B2 * | 10/2009 | Matsuyama et al. | 372/49.01 |
| 2005/0152419 A1 * | 7/2005 | Kishimoto et al. | 372/43 |
| 2008/0083930 A1 * | 4/2008 | Edmond et al. | 257/98 |
| 2008/0116471 A1 * | 5/2008 | Watanabe | 257/98 |
| 2008/0149950 A1 * | 6/2008 | Senda et al. | 257/90 |
| 2009/0127572 A1 * | 5/2009 | Tanaka et al. | 257/96 |
| 2009/0242918 A1 * | 10/2009 | Edmond et al. | 257/98 |
| 2010/0133505 A1 * | 6/2010 | Takao et al. | 257/13 |

* cited by examiner

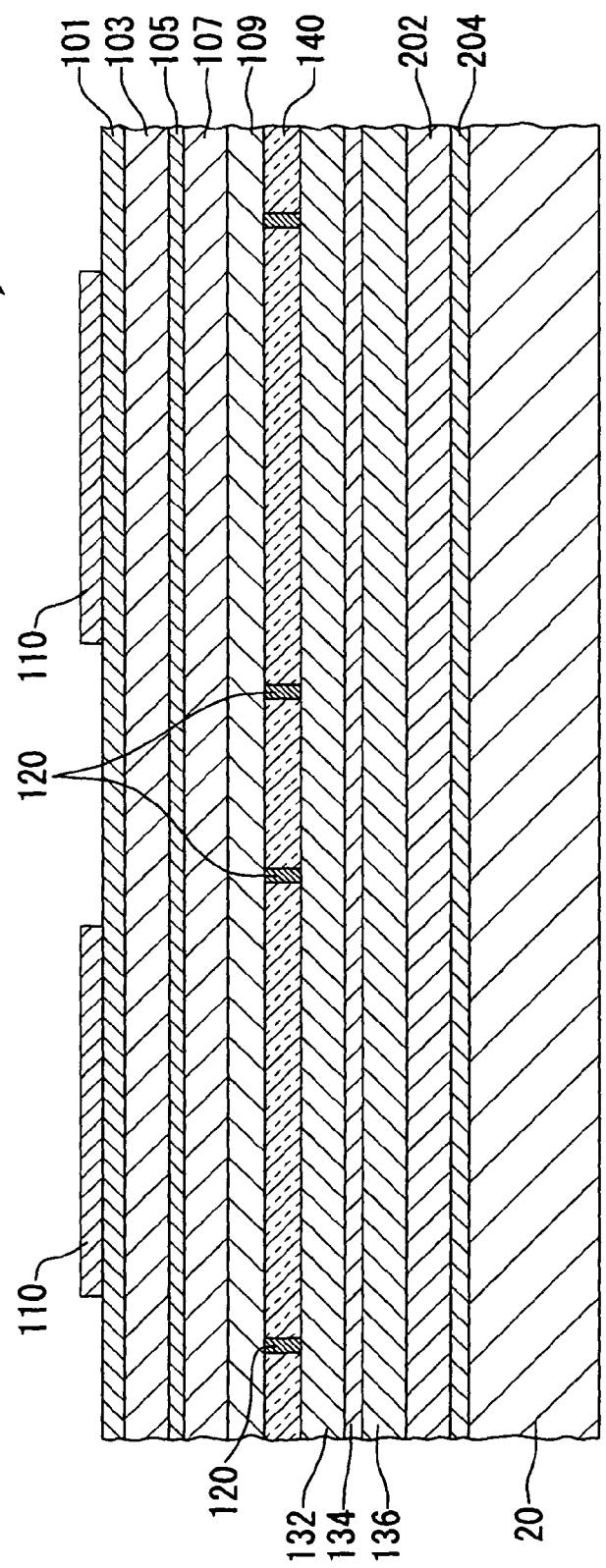

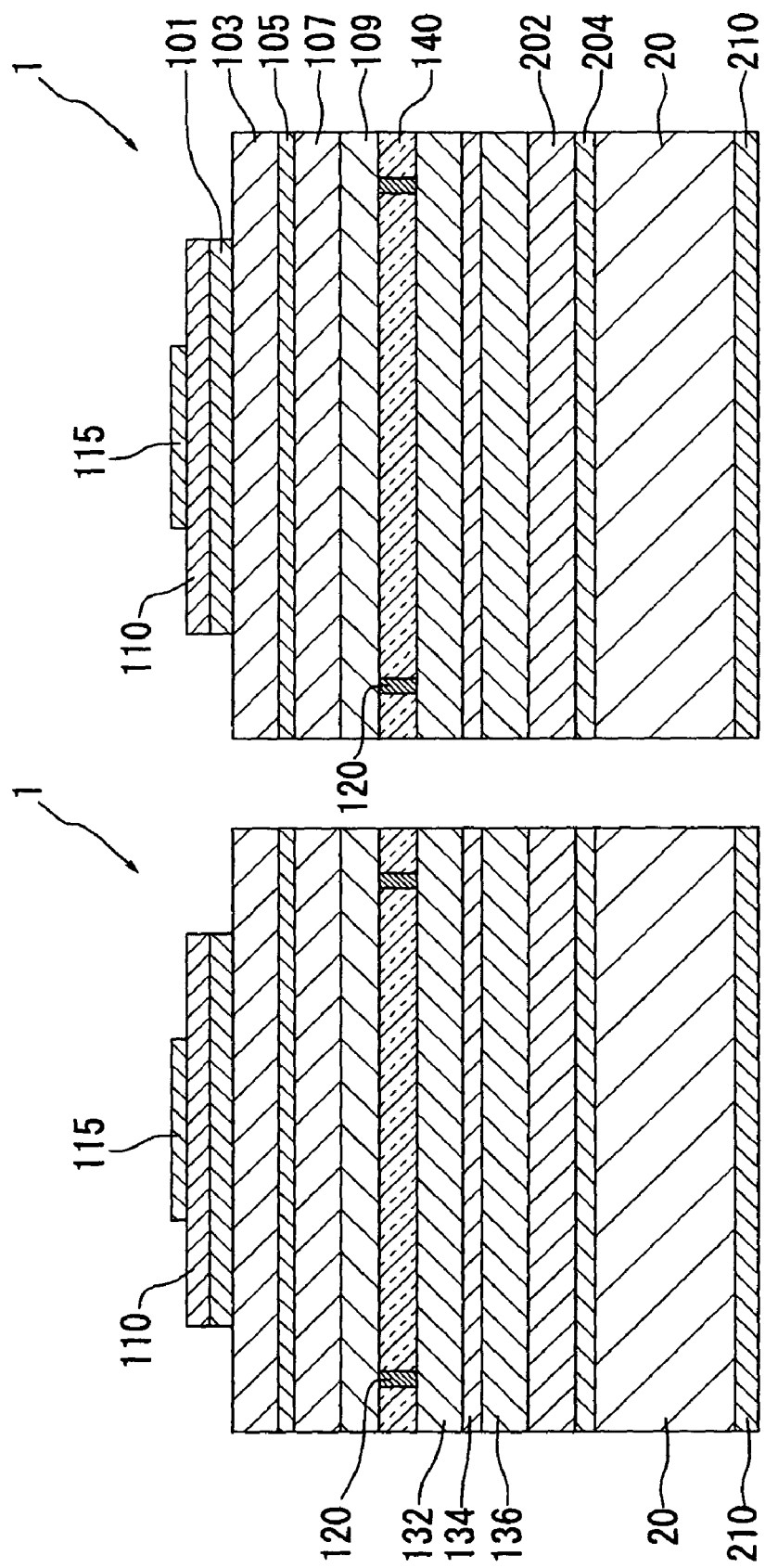

LIGHT EMITTING DEVICE AND METHOD FOR FABRICATING THE SAME INCLUDING A BACK SURFACE ELECTRODE WITH AN AU ALLOY

The present application is based on Japanese Patent Application No. 2008-234745 filed on Sep. 12, 2008, the entire contents of which are incorporated herein by reference.

BACKGROUND OF THE INVENTION

1. Field of the Invention

The present invention relates to a light emitting device, in more particular, to a light emitting device with high optical output which can be fabricated in high production yield, and a method for fabricating the same.

2. Related Art

As a conventional light emitting device, a light emitting device comprising a silicon supporting substrate having an anode electrode on one surface, a metal reflecting layer provided on another surface of the silicon supporting substrate, a light transmitting film formed on the metal reflecting layer and being in ohmic-contact with the metal reflecting layer, a semiconductor multilayer comprising a p-type semiconductor layer provided on the light transmitting film and being in ohmic-contact with the light transmitting film, an n-type semiconductor layer, and an active layer sandwiched by the p-type semiconductor layer and the n-type semiconductor layer, and a cathode electrode provided on the semiconductor multilayer has been known. Japanese Patent Laid-Open No. 2005-175462 (JP-A 2005-175462) discloses one example of the conventional light emitting devices.

In the light emitting device disclosed by JP-A 2005-175462, the light transmitting film having an electrical conductivity is provided between the semiconductor multilayer and the metal reflecting layer, so that the light transmitting film is in ohmic-contact with both of the semiconductor multilayer and the metal reflecting layer, thereby suppressing alloying between the semiconductor multilayer and the metal reflecting layer. Therefore, it is possible to compose the metal reflecting layer with excellent light reflection characteristic, thereby providing the light emitting device with improved light emitting efficiency.

However, there is a following disadvantage in the light emitting device disclosed by JP-A 2005-175462. Namely, when manufacturing the light emitting device, each of a plurality of light emitting devices is divided by a dicing process. At this time, so-called "back surface chipping" such as chip and crack occurs in a back surface of the silicon supporting substrate, so that there is a restriction for improving the production yield of the light emitting device.

SUMMARY OF THE INVENTION

Therefore, an object of the invention is to provide a light emitting device with high production yield.

According to a feature of the invention, a method for fabricating a light emitting device comprises:

providing a semiconductor multilayer structure having a first semiconductor layer of a first conductivity type, a second semiconductor layer of a second conductivity type different from the first conductivity type, and an active layer sandwiched between the first semiconductor layer and the second semiconductor layer;

forming a reflecting layer provided at a side of one surface of the semiconductor multilayer structure, the reflecting layer reflecting a light emitted from the active layer;

mechanically bonding the semiconductor multilayer structure with a supporting substrate provided at an opposite side of the reflecting layer with respect to the side of the semiconductor multilayer structure, the supporting substrate supporting the semiconductor multilayer structure via a metal bonding layer, the supporting substrate comprising Si or Ge; and forming a back surface electrode provided at an opposite side of the supporting substrate with respect to a side of the metal bonding layer, the back surface electrode comprising Au alloyed with the support substrate, a hardness of the back surface electrode being higher than a hardness of the Au.

According to a feature of the invention, a light emitting device comprises:

a semiconductor multilayer structure having a first semiconductor layer of a first conductivity type, a second semiconductor layer of a second conductivity type different from the first conductivity type, and an active layer sandwiched between the first semiconductor layer and the second semiconductor layer;

a reflecting layer provided at a side of one surface of the semiconductor multilayer structure, the reflecting layer reflecting a light emitted from the active layer;

a supporting substrate provided at an opposite side of the reflecting layer with respect to the side of the semiconductor multilayer structure, the supporting substrate supporting the semiconductor multilayer structure via a metal bonding layer, the supporting substrate comprising Si or Ge; and a back surface electrode provided at an opposite side of the supporting substrate with respect to a side of the metal bonding layer, the back surface electrode comprising Au alloyed with the support substrate, a hardness of the back surface electrode being higher than a hardness of the Au.

The light emitting device may further comprise:

an adhesion layer provided between the supporting substrate and the back surface electrode, the adhesion layer adhering the supporting substrate with the back surface electrode at least before the alloying of the Au and the supporting substrate, the adhesion layer comprising a thickness that does not prevent the Au and the supporting substrate from the alloying, in which the back surface electrode is formed by alloying the Au propagated through the adhesion layer with the supporting substrate.

In the light emitting device, the adhesion layer may comprise the thickness from 0.5 nm to 100 nm. The adhesion layer may comprise Ti. The back surface electrode may comprise a Au layer with a thickness not greater than 30 nm before the alloying. The supporting substrate may have a resistivity not greater than of back surface electrode comprises a Au layer with a thickness not greater than 0.01Ω·cm.

ADVANTAGES OF THE INVENTION

According to the light emitting device of the present invention, it is possible to provide a light emitting device with high production yield.

BRIEF DESCRIPTION OF THE DRAWINGS

Next, the light emitting device in preferred embodiments according to the invention will be explained in conjunction with appended drawings, wherein:

FIG. 7 is a cross sectional view showing the manufacturing process of the light emitting device in the preferred embodiment according to the invention;

FIG. 11 is a cross sectional view showing the manufacturing process of the light emitting device in the preferred embodiment according to the invention.

DETAILED DESCRIPTION OF THE PREFERRED EMBODIMENT

Next, the preferred embodiment according to the present invention will be explained in more detail in conjunction with the appended drawings.

The Preferred Embodiment

Figure 1A:
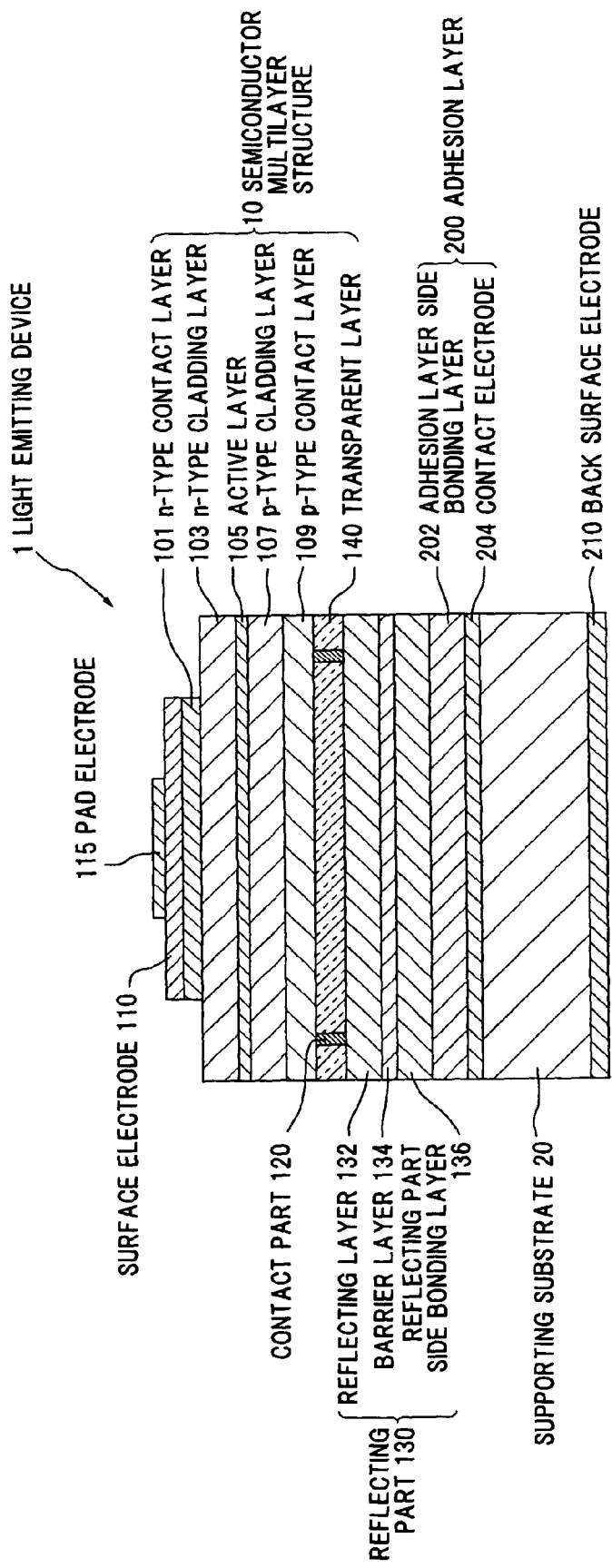
FIG. 1A is a schematic longitudinal cross sectional view of a light emitting device in a preferred embodiment according to the invention.
Figure 1B:
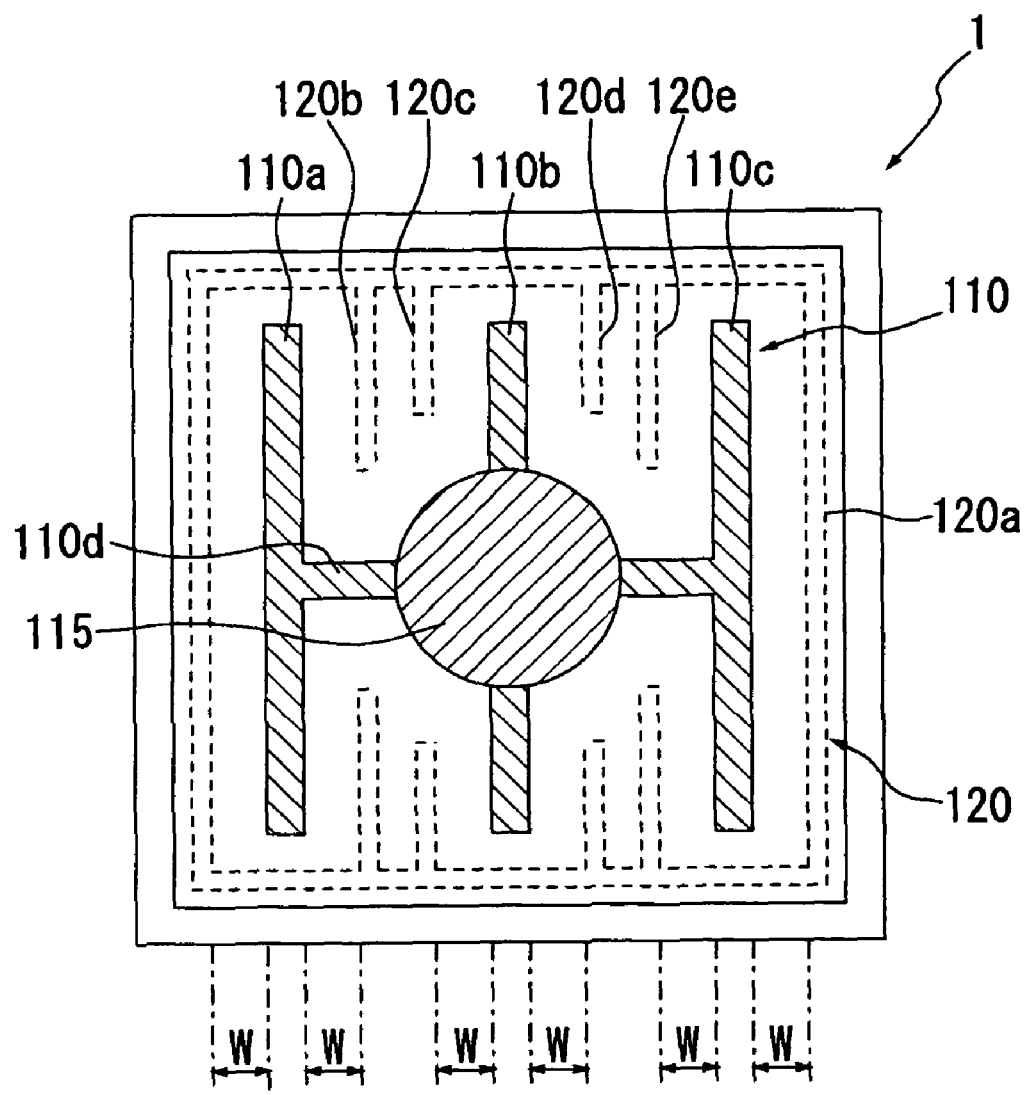
FIG. 1B is a schematic top plan view of the light emitting device in the preferred embodiment according to the invention.

FIG. 1A is a schematic longitudinal cross sectional view of a light emitting device in a preferred embodiment according to the invention. FIG. 1B is a schematic top plan view of the light emitting device in the preferred embodiment according to the invention.

(Outline of a Structure of the Light Emitting Device 1)

With referring to FIG. 1A, a light emitting device 1 comprises a semiconductor multilayer structure 10 having an active layer 105 which emits a light with a predetermined wavelength, a surface electrode 110 electrically connected to a region of a part of a surface of the semiconductor multilayer structure 10, a pad electrode 115 provided on a surface of the surface electrode 110 as a wire-bonding pad, a contact part 120 as an interface electrode being in ohmic-contact with a part of another surface of the semiconductor multilayer structure 10, a transparent layer 140 provided on another surface of the semiconductor multilayer structure 10 except a region where the contact part 120 is provided, and a reflecting part 130 provided on a surface of the contact part 120 and the transparent layer 140 at an opposite side with respect to another surface contacting with the semiconductor multilayer structure 10.

Further, the light emitting device 1 further comprises an adhesion layer 200 having an electrical conductivity and provided on a surface of the reflecting part 130 at an opposite side with respect to another surface contacting with the contact part 120 and the transparent layer 140, and a supporting substrate 20 having an electrical conductivity and provided on a surface of the adhesion layer 200 at an opposite side with respect to another surface contacting with the reflecting part 130, and a back surface electrode 210 provided on a surface of the supporting substrate 20 at an opposite side with respect to another surface contacting with the adhesion layer 200. The back surface electrode 210 comprises an alloy material at an interface between the back surface electrode 210 and the supporting substrate 20, and the alloy material contains gold (Au) and formed by alloying reaction between Au and the supporting substrate 20.

Further, the back surface electrode 210 may be entirely formed by the alloying reaction with the supporting substrate 20. Namely, the back surface electrode 210 may be formed as an alloy region formed at a back surface side of the supporting substrate 20 by alloying Au provided at the back surface of the supporting substrate 20 and the supporting substrate 20. For this case, a boundary between the back surface of the supporting substrate 20 and Au clearly exists along a horizontal direction of the back surface of the supporting substrate 20 before alloying. However, this boundary does not clearly exist as a horizontal boundary along the horizontal direction after alloying, since the alloy reaction occurs between the supporting substrate 20 and Au.

In addition, the semiconductor multilayer structure 10 in the light emitting device 1 in the preferred embodiment comprises a p-type contact layer 109 provided in contact with the contact part 120 and the transparent layer 140, a p-type cladding layer 107 provided as a second semiconductor layer with a second conductivity type on a surface of the p-type contact layer 109 at an opposite side with respect to another surface contacting with the transparent layer 140, the active layer 105 provided on a surface of the p-type cladding layer 107 at an opposite side with respect to another surface contacting with the p-type contact layer 109, an n-type cladding layer 103 provided as a first conductivity type first semiconductor layer provided on a surface of the active layer 105 at an opposite side with respect to another surface contacting with the p-type cladding layer 107, and an n-type contact layer 101 provided on a region of a surface of the n-type cladding layer 103 at an opposite side with respect to another surface contacting with the active layer 105. Herein, the surface of the semiconductor multilayer structure 10 at the opposite side with respect to another surface contacting with the transparent layer 140 is the light extracting surface of the light emitting device 1 in the preferred embodiment. More concretely, a part of the n-type cladding layer 103 at the opposite side with respect to another surface contacting with the active layer 105 is provided as the light extracting surface.

Further, the reflecting part 130 comprises a reflecting layer 132 provided in contact with the contact part 120 and the transparent layer 140, a barrier layer 134 provided on a surface of the reflecting layer 132 at an opposite side with respect to another surface contacting with the contact part 120 and the transparent layer 140, and a bonding layer 136 provided as one bonding layer on a surface of the barrier layer 134 at an opposite side with respect to another surface contacting with the reflecting layer 132. The adhesion layer 200 comprises a bonding layer 202 as another bonding layer electrically and mechanically bonded to the bonding layer 136 of the reflecting part 130, and a contact electrode 204 provided on a surface of the bonding layer 202 at an opposite side with respect to another surface contacting with the reflecting layer 130.

In addition, as shown in FIG. 1B, the light emitting device 1 in the preferred embodiment is formed to be substantially square in a top plan view. As an example, plane dimensions of the light emitting device 1 are a vertical length of 330 µm and a lateral length of 300 µm, respectively. Further, a thickness of the light emitting device 1 is formed to be about 210 µm. Still further, for example, the light emitting device 1 in the preferred embodiment may be composed as a light emitting device with a large-scale chip size in which the plane dimensions are 500 µm×500 µm or more.

(Detailed Structure of the Surface Electrode 110 and the Contact Part 120)

The surface electrode 110 and the contact part 120 will be explained in more detail. The surface electrode 110 comprises a circular electrode and a plurality of narrow electrodes to be provided on the n-type contact layer 101. For example, the surface electrode 110 comprises a narrow electrode 110a located in vicinity of one side of the light emitting device 1 formed to be substantially rectangular in top plan view, the narrow electrode 110a being substantially horizontal with the one side of the light emitting device 1, a narrow electrode 110c located in vicinity of an opposite side of the one side of the light emitting device 1, the narrow electrode 110c being substantially horizontal with the opposite side, and a narrow electrode 110b provided between the narrow electrode 110a and the narrow electrode 110c to be substantially equidistant from both of the narrow electrode 110a and the narrow electrode 110c, the narrow electrode 110b being substantially horizontal with the narrow electrode 110a and the narrow electrode 110c.

The surface electrode 110 further comprises a narrow electrode 110d extending along a direction substantially perpendicular to longitudinal directions of the narrow electrode 110a, the narrow electrode 110b and the narrow electrode 110c, the narrow electrode 110d being provided to be in contact with the narrow electrodes 110a, 110b, and 110c in the substantially middle of these narrow electrodes 110a, 110b, and 110c. In addition, the surface electrode 110 comprises a circular electrode in a region including an intersection point of the narrow electrode 110b and the narrow electrode 110d. The circular electrode is not shown in FIG. 1B, since the circular electrode is located right under the pad electrode 115. The pad electrode 115 is provided at a position in which a center of the light emitting device 1 is substantially coincident with a center of the pad electrode 115. In other words, the pad electrode 115 is provided right above the circular electrode.

Next, the contact part 120 is provided with a unitary without a cutting part in the top plan view within an opening located in a part other than a region of the transparent layer 140 right under the surface electrode 110 in the top plan view. For example, the contact part 120 comprises an outer periphery part 120a having a shape provided along an outer periphery of the light emitting device 1, and a narrow linear part 120b extending from one side of the outer periphery part 120a toward a center in a predetermined length, the narrow liner part 120b being in contact with the outer periphery part 120a at one end, and a narrow linear part 120c provided to be adjacent to the narrow linear part 120b at a position closer to the side of the pad electrode 115 than the narrow linear part 120b, the narrow linear part 120c being formed in a length shorter than a length of the narrow linear part 120b.

The contact part 120 further comprises a narrow linear part 120d and a narrow linear part 120e, which are provided in symmetrical positions to the narrow linear part 120b and the narrow linear part 120c with respect to a center line of the narrow electrode 110b facing to a longitudinal direction of the narrow electrode 110b as an axis of symmetry (not shown). The contact part 120 further comprises a plurality of narrow parts, which are provided in symmetrical positions to the narrow linear part 120b and the narrow linear part 120e with respect to a center line of the narrow electrode 110d as an axis of symmetry.

The surface electrode 110 and the contact part 120 are arranged such that the surface electrode 110 does not superpose the contact part 120 in the top plan view. For example, the narrow linear part 120b and the narrow linear part 120c are located between the narrow electrode 110a and the narrow electrode 110b in the top plan view. In addition, each of the narrow linear part 120b and the narrow linear part 120c is formed in such a length that does not contact with the narrow electrode 110d in the top plan view. Similarly, the narrow linear part 120d and the narrow linear part 120e are located between the narrow electrode 110b and the narrow electrode 110c in the top plan view. In addition, each of the narrow linear part 120d and the narrow linear part 120e is formed in such a length that does not contact with the narrow electrode 110d in the top plan view. Herein, when a minimum length from an outer edge of the narrow electrode of the surface electrode 110 to an outer edge of the contact part 120 is defined as "W" in the top plan view of the light emitting device 1, the surface electrode 110 and the contact part 120 are arranged such that each W is substantially equal to each other. In addition, a length between each of front edges of the narrow electrodes 110a-110c and the edge of the contact part 120 is W or more.

The circular electrode of the surface electrode 110 is formed to have a diameter of at least 75 µm in accordance with a diameter of a ball section of a wire comprising a metallic material such as Au, which is connected to the pad electrode 115 provided on the circular electrode. As an example, the circular electrode of the surface electrode 110 is formed to have a circular shape with a diameter of 100 µm. The narrow electrodes 110a-110d of the surface electrode 10 are formed to have a linear shape with a width of 10 µm. Furthermore, the contact part 120 is provided at a part of the surface of the p-type contact layer 109, except a region right under the surface electrode 110. As an example, each of the narrow linear parts is formed to have a width of 5 µm. More concretely, the contact part 120 is formed within the opening penetrating through the transparent layer 140, to electrically connect the semiconductor multilayer structure 10 with the reflecting layer 132. As an example, the contact part 120 comprises a metallic material including Au and Zn.

(Semiconductor Multilayer Structure 10)

The semiconductor multilayer structure 10 in the preferred embodiment comprises an AlGaInP based compound semiconductor which is a III-V group compound semiconductor. More concretely, the semiconductor multilayer structure 10 has a configuration in which the active layer 105 comprising an undoped AlGaInP based compound semiconductor bulk which is not doped with a dopant of an impurity is sandwiched between the n-type cladding layer 103 comprising an n-type AlGaInP and the p-type cladding layer 107 comprising a p-type AlGaInP.

The active layer 105 emits the light with the predetermined wavelength when the electric current is supplied from the outside to the active layer 105. For example, the active layer 105 comprises a compound semiconductor which emits a red light with a wavelength of around 630 nm. As an example, the active layer 105 comprises an undoped $(Al_{0.1}Ga_{0.9})_{0.5}In_{0.5}P$ layer. The n-type cladding layer 103 contains a predetermined concentration of an n-type dopant such as Si and Se. As an example, the n-type cladding layer 103 comprises a Si-doped $(Al_{0.7}Ga_{0.3})_{0.5}In_{0.5}P$ layer. The p-type cladding layer 107 contains a predetermined concentration of a p-type dopant such as Zn and Mg. As an example, the p-type cladding layer 107 comprises a Mg-doped $(Al_{0.7}Ga_{0.3})_{0.5}In_{0.5}P$ layer.

Furthermore, the p-type contact layer 109 of the semiconductor multilayer structure 10 comprises a p-type GaP layer doped with Mg at a predetermined concentration. The n-type contact layer 101 comprises a GaAs layer doped with Si at a predetermined concentration. The n-type contact layer 101 is provided at a region in which at least the surface electrode 110 is provided on an upper surface of the n-type cladding layer 103.

(Transparent Layer 140)

The transparent layer 140 is provided at a region where the contact part 120 is not provided on the surface of the p-type contact layer 109. The transparent layer 140 comprises a material which transmits a light with the wavelength of the light emitted from the active layer 105. For example, the transparent layer 140 comprises a transparent material with respect to the light emitted from the active layer 105. As an example, the transparent layer 140 comprises a transparent dielectric layer such as $SiO_2$, $TiO_2$, and $SiN_x$. In addition, the transparent layer 140 has a function as a current blocking layer for blocking the electric current flow in a part where the transparent layer 140 is provided. An opening penetrates through a predetermined region, in which the contact part 120 of the transparent layer 140 is formed, along a thickness direction, and the opening is filled with a metallic material to provide the contact part 120.

(Reflecting Part 130)

The reflecting layer 132 of the reflecting part 130 comprises a conductive material having a high reflectivity with respect to the light emitted from the active layer 105. As an example, the reflecting layer 132 comprises a conductive material having a reflectivity of 80% or more with respect to the light emitted from the active layer 105. The reflecting layer 132 reflects the light that is emitted from the active layer 105 and reached the reflecting layer 132 toward the active layer 105. For example, the reflecting layer 132 comprises a metallic material such as Al, Au, and Ag, or alternatively an alloy including at least one selected from these metallic materials. As an example, the reflecting layer 132 may comprise Au with a predetermined film thickness. The barrier layer 134 of the reflecting part 130 comprises a metallic material such as Ti and Pt. As an example, the barrier layer 134 may comprise Pt with a predetermined film thickness. The barrier layer 134 suppresses the material composing the bonding layer 136 from propagating (dispersing) into the reflecting layer 132. In addition, the bonding layer (reflecting part side bonding layer) 136 comprises a material that is electrically and mechanically bonding to the bonding layer (adhesion layer side bonding layer) 202 of the adhesion layer 200. As an example, the bonding layer 136 may comprise Au with a predetermined film thickness.

(Supporting Substrate 20)

The supporting substrate 20 comprises an electrically conductive material. For example, the supporting substrate 20 may comprise a semiconductor substrate such as p-type or n-type conductive Si substrate. In this preferred embodiment, a Si substrate having a resistivity of 0.01Ω·cm or less is used. In addition, a face orientation of the Si substrate as the supporting substrate 20 is not limited and may be any orientation.

The bonding layer 202 of the adhesion layer 200 may comprise Au with a predetermined thickness, similarly to the bonding layer 136 of the reflecting part 130. In addition, the contact electrode 204 comprises a metallic material that is electrically connected to the supporting substrate 20 and suppresses the material composing the bonding layer 202 from propagating to the side of the support substrate 20. For example, the contact electrode 204 may comprise Ti with a predetermined thickness.

The back surface electrode 210 comprises a material that is electrically connected to the supporting substrate 20. The back surface electrode 210 is provided on a back surface of the supporting substrate 20 (i.e. a surface at an opposite side with respect to a surface where the contact electrode 204 is provided) via a thin adhesion layer having such a thickness that does not prevent the back surface electrode 210 and the supporting substrate 20 from alloying therebetween. More concretely, the back surface electrode 210 comprises an alloy including Au provided at the back surface of the supporting substrate 20 and a part of the supporting substrate 20. Since the back surface electrode 210 comprises the alloy of the supporting substrate 20 and Au, the back surface electrode 210 has a hardness higher than a hardness of Au per se. In addition, the light emitting device 1 is mounted at a predetermined position of a stem comprising a metallic material such as Al and Cu, by using a conductive bonding material such as Ag pates, or a eutectic material such as AuSn, in the state that a side of the back surface electrode 210 is located downwardly.

(Variations)

The light emitting device 1 in the preferred embodiment emits the light including red at a wavelength of 630 nm. However, the wavelength of the light emitted from the light emitting device 1 is not limited to this wavelength. Further, it is possible to form the light emitting device 1 which emits a light in a predetermined wavelength range by controlling the structure of the active layer 105 of the semiconductor multilayer structure 10. The active layer 105 emits the light within the wavelength range of e.g. orange light, yellow light, and green light.

In the semiconductor multilayer structure 10 of the light emitting device 1, a conductivity type of the compound semiconductor layer composing the semiconductor multilayer structure 10 may be changed to a conductivity type opposite to the conductivity type in this preferred embodiment. For example, the conductivity type of the n-type contact layer 101 and the n-type cladding layer 103 may be changed to p-type, and the conductivity type of the p-type cladding layer 107 and the p-type contact layer 109 may be changed to n-type.

A shape of the surface electrode 110 in the top plan view is not limited to the shape in the preferred embodiment, and may be another shape such as rectangular, rhombic, and polygonal in the top plan view. Furthermore, the contact part 120 is formed to have the unitary shape without any cutting part. In the variation, however, the contact part 120 comprising plural regions may be formed by forming a cutting part in a part of the contact part 120. For example, the contact part 120 may be formed as a dot shape.

The plane dimensions of the light emitting device 1 are not limited to that in the preferred embodiment. For example, the plane dimensions of the light emitting device 1 may be designed such that the vertical length is greater than 1 mm and the lateral length is greater than 1 mm. In addition, the vertical length and the lateral length may be changed appropriately in accordance with application of the light emitting device 1. As an example, when the plane dimensions of the light emitting device 1 are designed such that the vertical length is shorter than the lateral length, the shape of the light emitting device 1 in the top plan view is substantially rectangular.

The active layer 105 may comprise a quantum well structure. The quantum well structure may comprise a single quantum well structure, a multiquantum well structure or a strain multiquantum well structure.

(Process for Fabricating the Light Emitting Device 1)

FIGS. 2A, 2B, 3A, 31B, 4, 5A, 5B, 6A, 6B, 7, 8, 9, 10 and 11 are diagrams showing a process for fabricating the light emitting device in the first preferred embodiment.

Figure 2A:
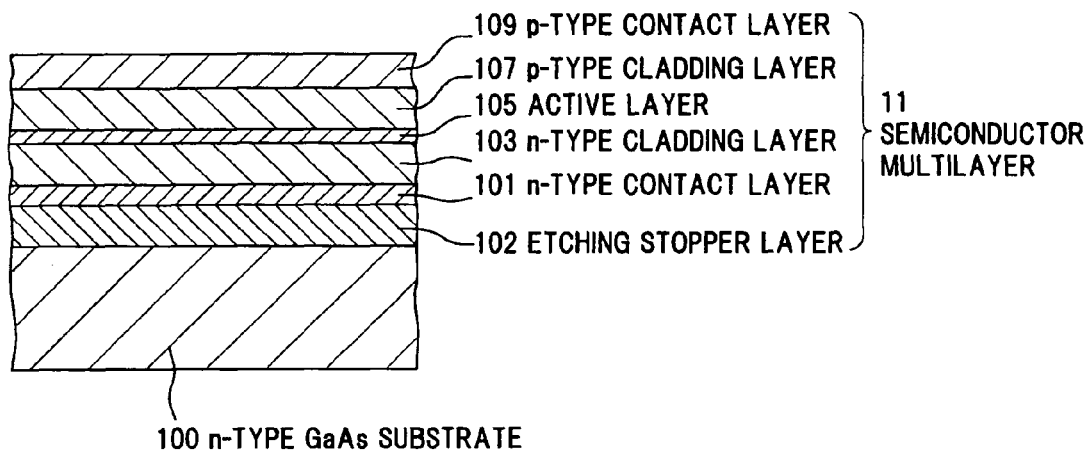
FIG. 2A is a cross sectional view showing a manufacturing process of the light emitting device in the preferred embodiment according to the invention.

At first, as shown in FIG. 2A, an AlGaInP based semiconductor multilayer 11 including plural compound semiconductor layers comprises is grown by Metal Organic Vapor Phase Epitaxy (MOVPE) on an n-type GaAs substrate 100, for example. More concretely, the etching stopper layer 102 comprising an undoped $(Al_{0.7}Ga_{0.3})_{0.5}In_{0.5}P$, an n-type contact layer 101 comprising a Si-doped n-type GaAs, the n-type cladding layer 103 comprising a Si-doped n-type $(Al_{0.7}Ga_{0.3})_{0.5}In_{0.5}P$, the active layer 105 comprising an undoped $(Al_{0.1}Ga_{0.9})_{0.5}In_{0.5}P$, and the p-type cladding layer 107 comprising a Mg-doped p-type $(Al_{0.7}Ga_{0.3})_{0.5}In_{0.5}P$, and the p-type contact layer 109 comprising a Mg-doped p-type GaP are grown in this order on the n-type GaAs substrate 100, to provide an epitaxial wafer in which the semiconductor multilayer 11 is formed on the n-type GaAs substrate 100.

As sources used in the MOVPE method, an organometallic compound such as trimethylgallium (TMGa), triethylgallium (TEGa), trimethylaluminum (TMAl), and trimethylindium (TMIn), and a hydride gas such as arsin ($AsH_3$) and phosphine ($PH_3$) may be used. Further, as a source of the n-type dopant, disilane ($Si_2H_6$) may be used. As a source of the p-type dopant, biscyclopentadienyl magnesium ($Cp_2Mg$) may be used.

Further, as the source of the n-type dopant, hydrogen selenide ($H_2Se$), monosilane ($SiH_4$), diethyl tellurium (DETe) or dimethyl tellurium (DMTe) may be used. As the source of the p-type dopant, dimethylzinc (DMZn) or diethylzinc (DEZn) may be used.

In addition, the semiconductor multilayer 11 may be grown on the n-type GaAs substrate 100 by using Molecular Beam Epitaxy (MBE) method. In addition, the GaN system semiconductor multilayer 11 may be grown by using Halide Vapor Phase Epitaxy (HVPE) method.

Figure 2B:
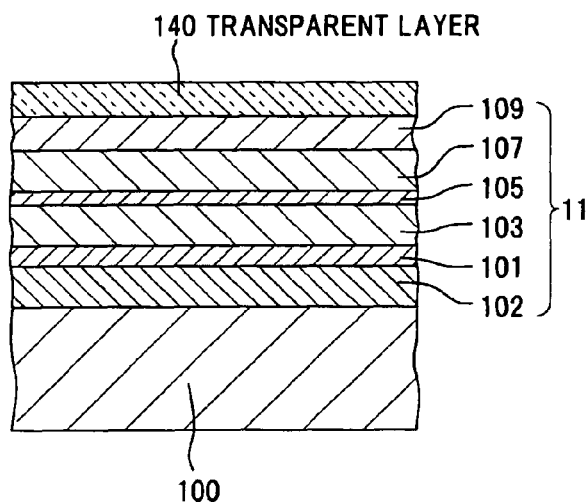
FIG. 2B is a cross sectional view showing the manufacturing process of the light emitting device in the preferred embodiment according to the invention.

Next, as shown in FIG. 2B, after taking out the epitaxial wafer formed as shown in FIG. 2A of the MOVPE equipment, a transparent layer 140 is formed on the surface of p-type contact layer 109. More concretely, a $SiO_2$ film as the transparent layer 140 is formed on the surface of p-type contact layer 109 by plasma Chemical Vapor Deposition (CVD) equipment. Herein, the transparent layer 140 may be formed by vacuum deposition method.

Figure 3A:
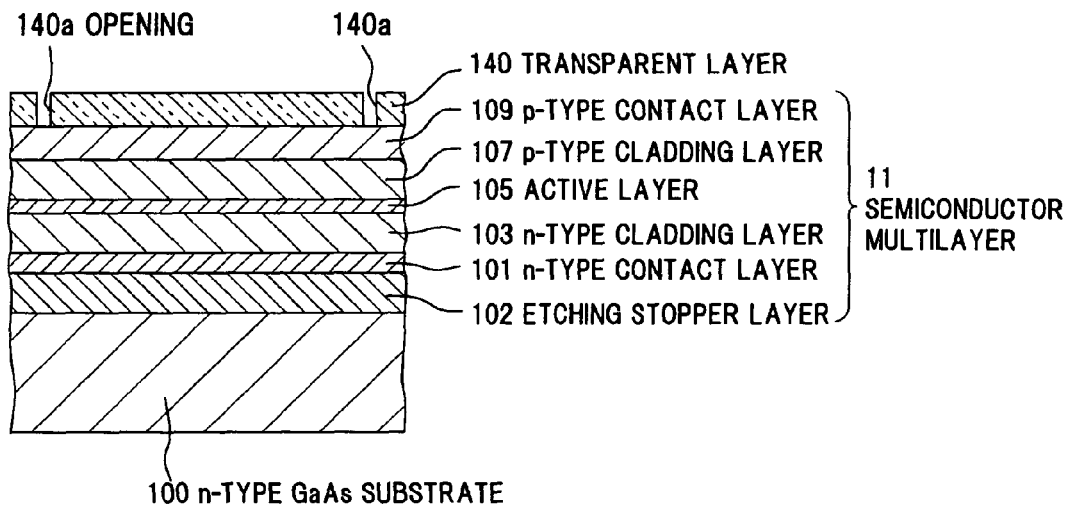
FIG. 3A is a cross sectional view showing the manufacturing process of the light emitting device in the preferred embodiment according to the invention.

Next, as shown in FIG. 3A, openings 140a are formed at the transparent layer 140 by using photolithography method and etching method. For example, a photoresist pattern having a groove at a region corresponding to the opening 140a is formed on the transparent layer 140. The openings 140a are formed to penetrate through the transparent layer 140 from a surface of the transparent layer 140 until an interface between the p-type contact layer 109 and the transparent layer 140. More concretely, the openings 140a are formed at the transparent layer 140 by removing regions where the photoresist pattern is not formed of the transparent layer 140 with use of a fluorinated acid based etchant diluted with demineralized water. The openings 140a are formed at regions where the contact parts 120 will be provided as explained in FIG. 1B.

Figure 3B:
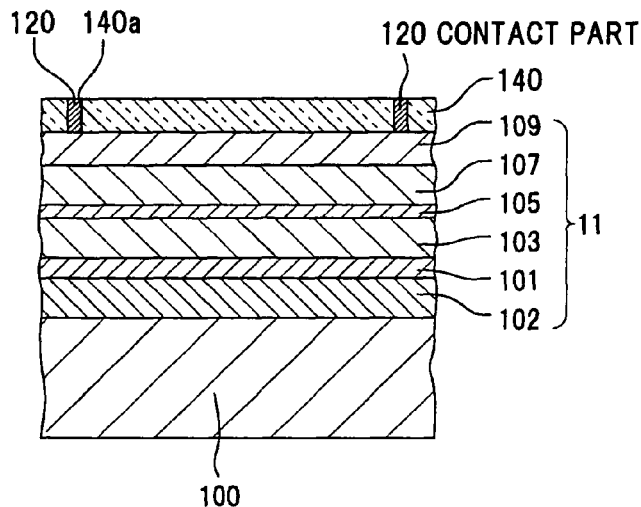
FIG. 3B is a cross sectional view showing the manufacturing process of the light emitting device in the preferred embodiment according to the invention.

Subsequently, as shown in FIG. 3B, a AuZn alloy (Au:Zn=95 wt %:5 wt %) which is a material composing the contact part 120 is formed within the opening 140a by using the vacuum deposition method and lift-off method. For example, AuZn is vacuum-evaporated within the opening 140a by using the photoresist pattern for forming the opening 140a as a mask, to provide the contact part 120 comprising AuZn as shown in FIG. 3B. The detailed explanation of the configuration of the contact part 120 is omitted here, since the configuration of the contact part 120 is explained in detail in the "Detailed structure of the surface electrode 110 and the contact part 120".

Figure 4:
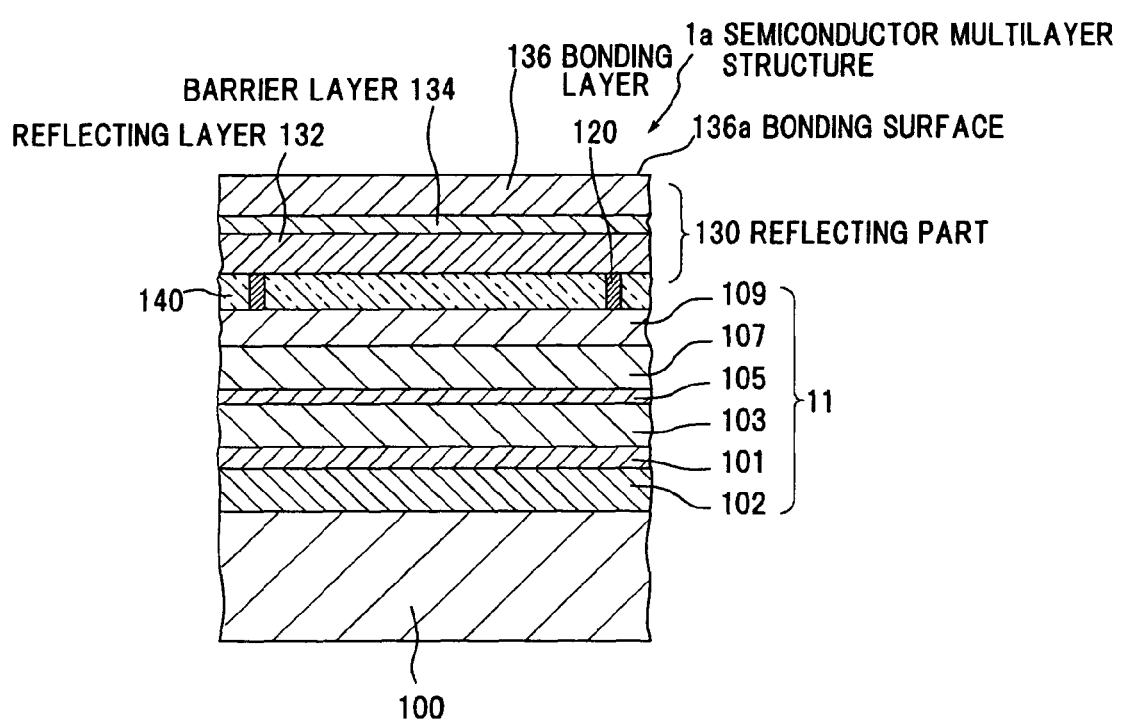
FIG. 4 is a cross sectional view showing the manufacturing process of the light emitting device in the preferred embodiment according to the invention.

Next, as shown in FIG. 4, an Al layer as the reflecting layer 132, a Pt layer as the barrier layer 134, and a Au layer as the bonding layer 136 are formed by using the vacuum deposition method or sputtering method, to provide a semiconductor multilayer structure 1a. Herein, as the reflecting layer 132, a material having a high reflectivity with respect to the wavelength of the light emitted from the active layer 105 may be selected.

Figure 5A:
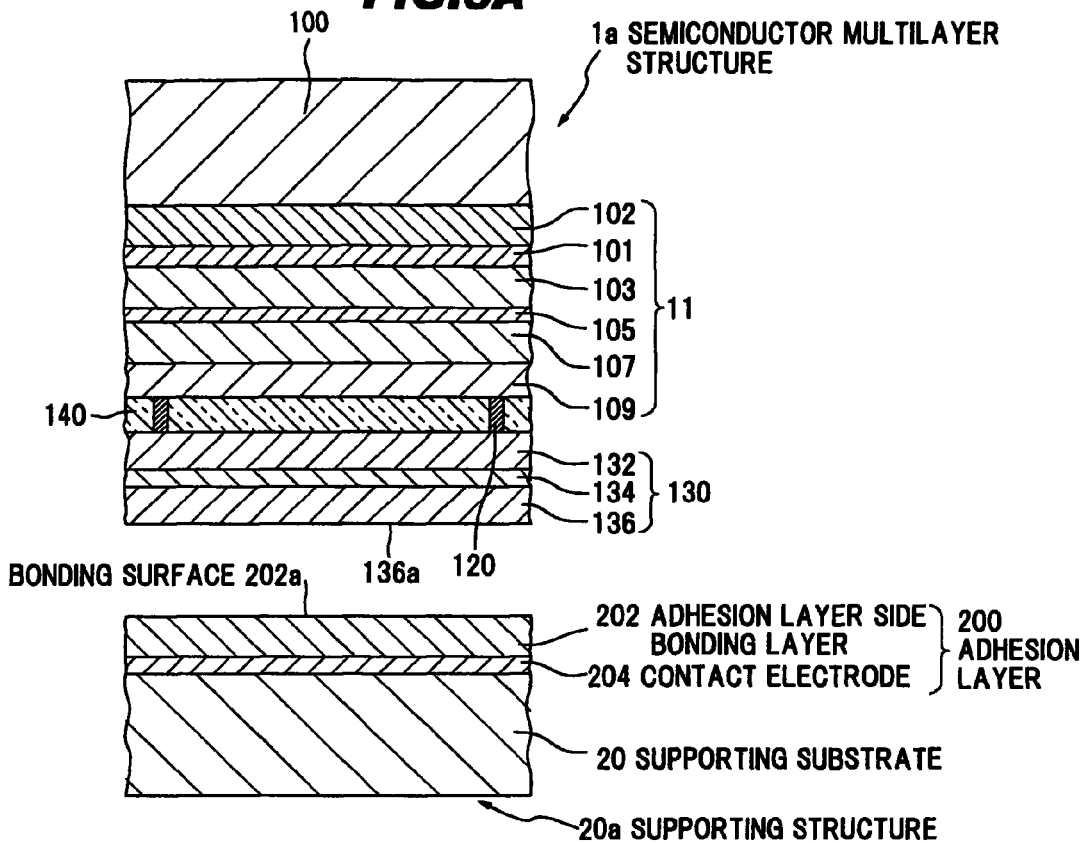
FIG. 5A is a cross sectional view showing the manufacturing process of the light emitting device in the preferred embodiment according to the invention.

Next, as shown in FIG. 5A, Ti as the contact electrode 204 also serving as a barrier layer and Au as the bonding layer 202 are formed in this order on the Si substrate as the supporting substrate 20 by using the vacuum deposition method, to provide a supporting structure 20a. Successively, a bonding surface 136a which is a surface of the bonding layer 136 of the semiconductor multilayer structure 1a and a bonding surface 202a which is a surface of the bonding layer 202 of the supporting structure 20a are stuck to be facing to each other, and held in this state by a jig made from carbon or the like.

Next, the jig holding the state that the semiconductor multilayer structure 1a is stuck on the supporting structure 20a is introduced in a wafer bonding equipment. Then, the wafer bonding equipment is depressurized to a predetermined pressure. As an example, the predetermined pressure is set as 1.333 Pa (0.01 Torr). Then, a pressure is applied through the jig to the semiconductor multilayer structure 1a and the supporting structure 20a overlapped with each other. As an example, a pressure of 15 kgf/cm$^2$ is applied. Next, the jig is heated to a predetermined temperature with a predetermined rate of temperature elevation.

Figure 5B:
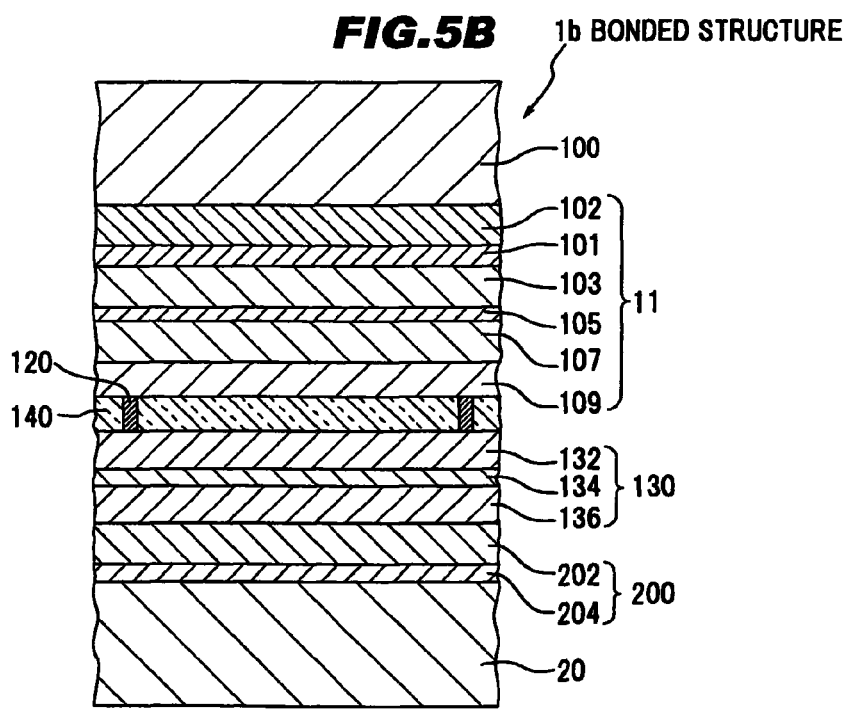
FIG. 5B is a cross sectional view showing the manufacturing process of the light emitting device in the preferred embodiment according to the invention.

More concretely, the temperature of the jig is raised to 350° C. After the temperature of the jig reached to 350° C., the jig is held at the temperature of 350° C. for about thirty (30) minutes. Then, the jig is gradually cooled and the temperature of the jig is decreased enough, for example, to the room temperature. After the temperature of the jig fell, the pressure applied to the jig is left open. After the pressure in the wafer bonding equipment is increased to an atmospheric pressure, the jig is taken out from the equipment. According to this process, as shown in FIG. 5B, a bonded structure 1b, in which the semiconductor multilayer structure 1a and the supporting structure 20a are mechanically bonded with each other between the bonding layer 136 and the bonding layer 202, is formed.

In this preferred embodiment, the semiconductor multilayer structure 1a comprises the barrier layer 134. Therefore, even though the semiconductor multilayer structure 1a and the supporting structure 20a are bonded to each other by using the bonding surface 136a and the bonding surface 202a, it is possible to suppress the diffusion of the material composing the bonding layer 136 and the bonding layer 202 into the reflecting layer 132, thereby suppressing the deterioration of the reflecting property of the reflecting layer 132.

Next, the bonded structure 1b is stuck by an attaching wax on a jig of a lapping equipment. More concretely, a surface at a side of the supporting substrate 20 is attached to the jig. Then, the n-type GaAs substrate 100 of the bonded structure 1b is lapped to have a predetermined thickness. Subsequently, the bonded structure 1b after lapping is detached from the jig of the lapping equipment, and the wax bonded to the surface of the supporting substrate 20 is removed by cleaning.

Figure 6A:
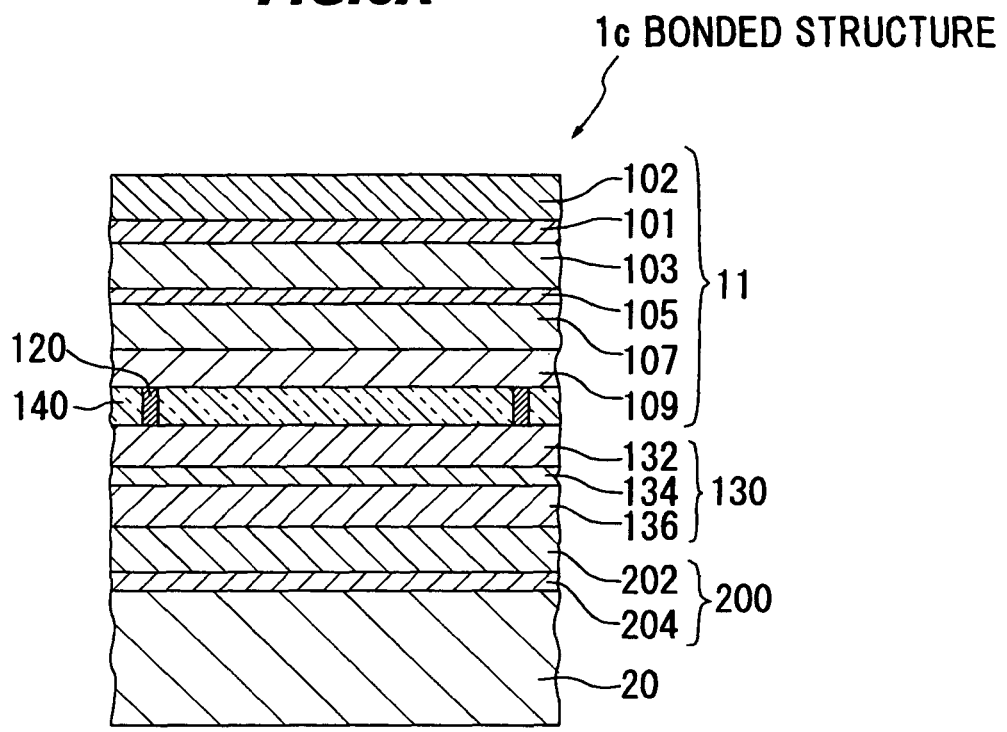
FIG. 6A is a cross sectional view showing the manufacturing process of the light emitting device in the preferred embodiment according to the invention.

Thereafter, as shown in FIG. 6A, the n-type GaAs substrate 100 is completely removed from the bonded structure 1b after lapping by selective etching using an etchant for GaAs etching, to form a bonded structure 1c in which an etching stopper layer 102 is exposed. As the etchant for GaAs etching, a mixture of ammonia water and hydrogen peroxide water may be used. In addition, the n-type GaAs substrate 100 may be completely removed by selective etching without lapping the n-type GaAs substrate 100.

Figure 6B:
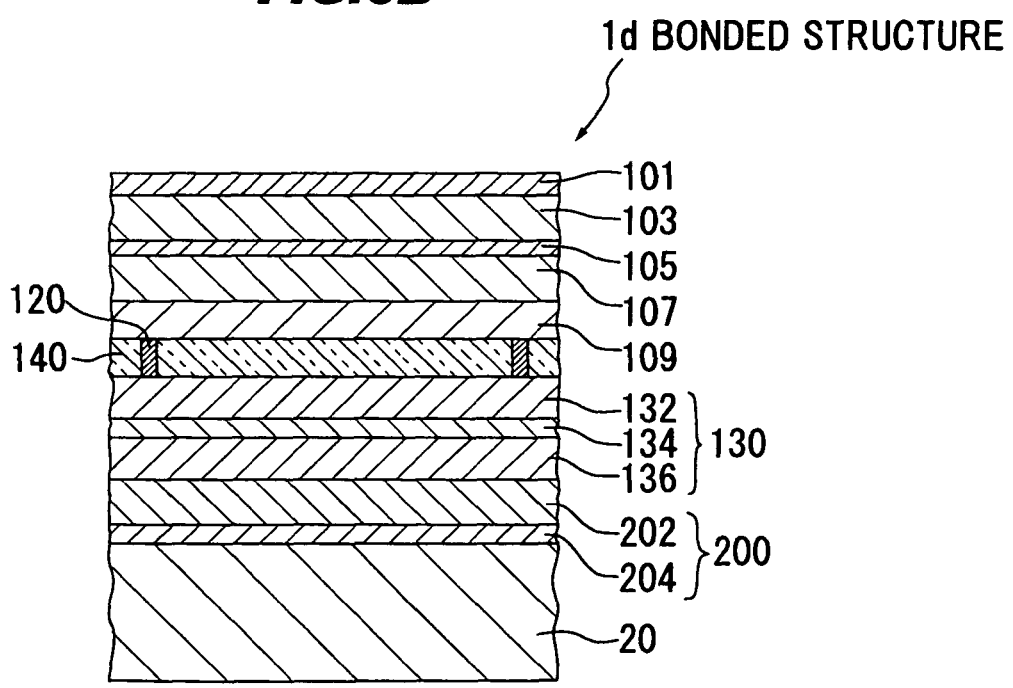
FIG. 6B is a cross sectional view showing the manufacturing process of the light emitting device in the preferred embodiment according to the invention.

Subsequently, as shown in FIG. 6B, the etching stopper layer 102 is removed from the bonded structure 1c by etching with use of a predetermined etchant to provide the bonded structure 1d in which the etching stopper layer 102 is removed. When the etching stopper layer 102 comprises an AlGaInP based compound semiconductor, an etchant including hydrochloric acid may be used. According to this step, a surface of the n-type contact layer 101 is exposed to the outside.

Successively, the surface electrode 110 is formed at a predetermined position on the surface of the n-type contact layer 101 by the photo lithography method and the vacuum deposition. The surface electrode 110 comprises the circular electrode having a diameter of 100 μm and the narrow electrodes each having a width of 10 μm. The surface electrode 110 may be formed, for example, by depositing AuGe, Ni, and Au on the n-type contact layer 101 in this order. For this case, the surface electrode 110 is formed not to be located right above the contact part 120. The detailed explanation of the configuration of the surface electrode 110 is omitted here, since the configuration of the surface electrode 110 is explained in detail in the "Detailed structure of the surface electrode 110 and the contact part 120". According to this process, a bonded structure 1e having the surface electrode 110 is formed as shown in FIG. 7.

Figure 8:
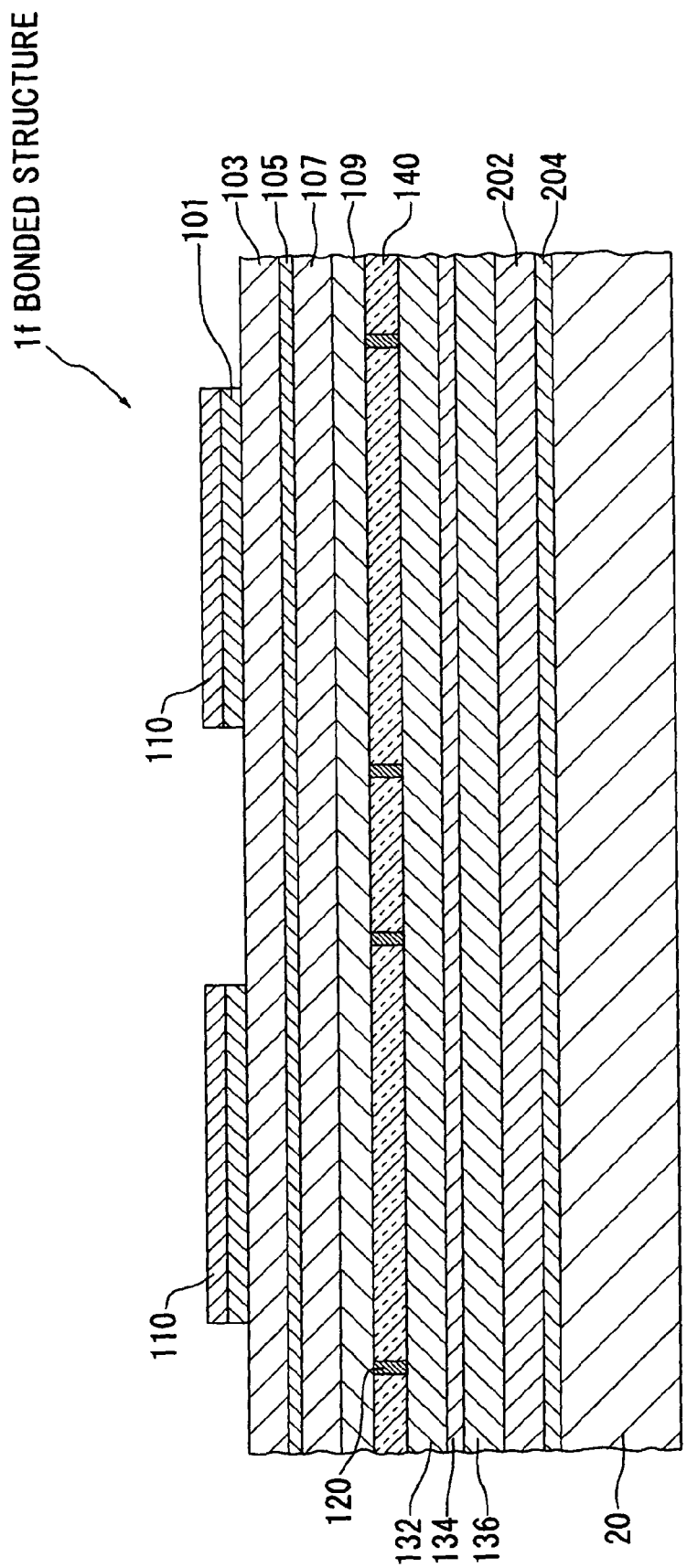
FIG. 8 is a cross sectional view showing the manufacturing process of the light emitting device in the preferred embodiment according to the invention.

Next, as shown in FIG. 8, the etching treatment using a mixture of sulfuric acid and hydrogen peroxide water is performed on the n-type contact layer 101, except a part of the n-type contact layer 101 provided right under the surface electrode 110, with using the surface electrode 110 formed in the step shown in FIG. 7 as a mask, thereby providing a bonded structure 1f. By using the above mixture, it is possible to selectively etch the n-type contact layer 101 comprising GaAs as against the n-type cladding layer 103 comprising the n-type $(Al_{0.7}Ga_{0.3})_{0.5}In_{0.5}P$. Therefore, in the bonded structure 1f, a surface of the n-type cladding layer 103 is exposed to the outside.

Figure 9:
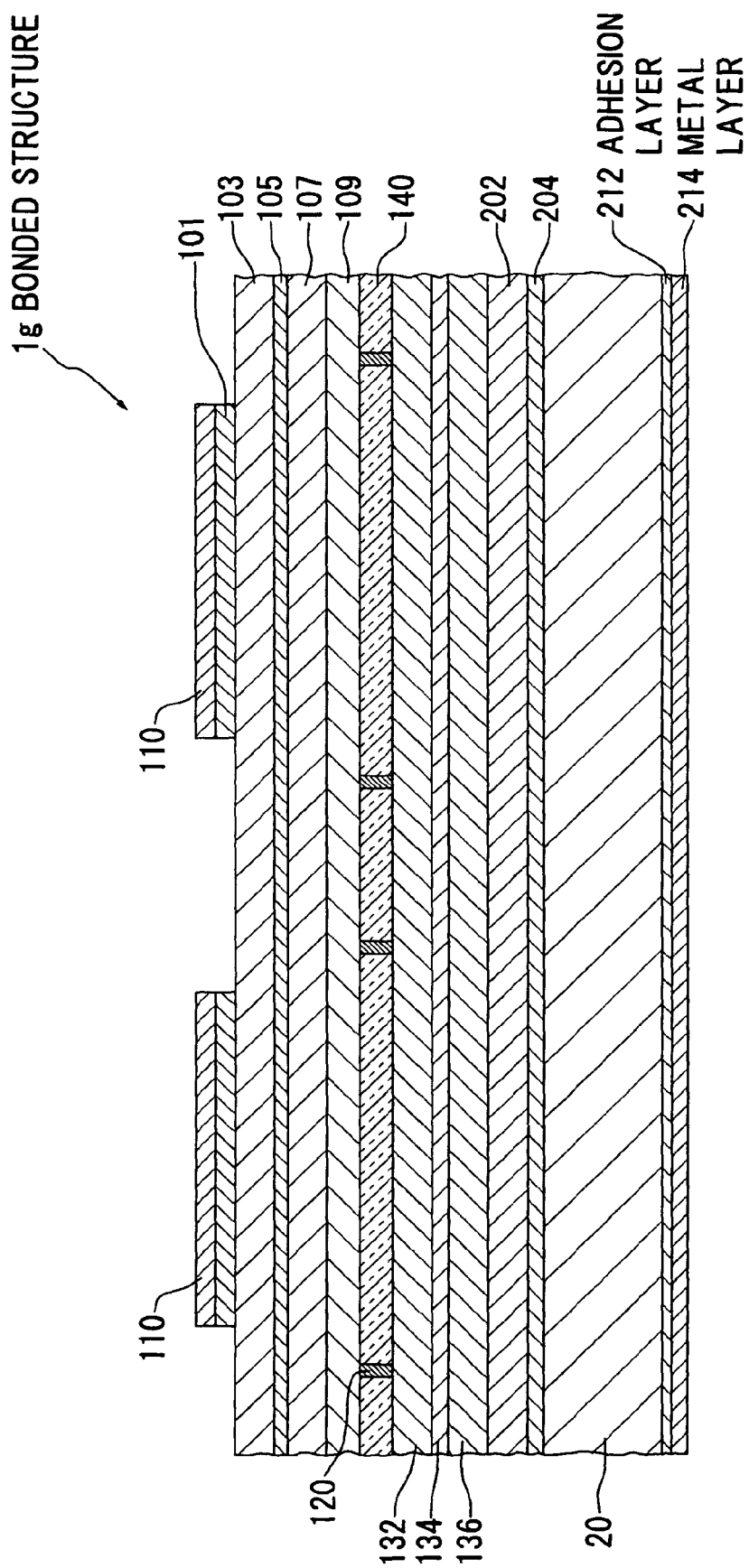
FIG. 9 is a cross sectional view showing the manufacturing process of the light emitting device in the preferred embodiment according to the invention.

Next, as shown in FIG. 9, the adhesion layer 212 and the metal layer 214 are formed in this order by vacuum deposition on the back surface of the supporting substrate 20 (on the surface at the opposite side with respect to the surface where the contact electrode 204 of the supporting substrate 20 is provided). The adhesion layer 212 comprises a material having a good adhesion property with the supporting substrate 20, and is formed to have such a thickness that does not prevent the metal layer 214 and the supporting substrate 20 from alloying. For example, the adhesion layer 212 comprises Ti with a thickness of about several nanometers (nm) to a dozen nanometers (nm). In the preferred embodiment, the back surface of the supporting substrate is preferably covered with an extremely thin adhesion layer 212 having an average thickness of several nanometers (nm) to a dozen nanometers (nm) as shown in FIG. 9 in that the metal layer 214 is shown as a layer. However, when the adhesion layer 212 having the average thickness of several nanometers (nm) to a dozen nanometers (nm) is formed by the vacuum deposition method, there is a possibility that an entire surface of the back surface cannot be covered because of layer formation mechanism by the deposition. In this case, Ti is scattered (in dots) on the back surface as Ti particle aggregates or Ti superfine particles, and the thickness of the adhesion layer is calculated from a deposition time of sputtering or vacuum deposition. Even though the adhesion layer 212 comprises the scattered Ti, the function of the adhesion layer 212 in this preferred embodiment can be performed. On the other hand, the metal layer 214 comprises a material that is hardly alloyed with the adhesion layer 212 and that is easily alloyed with the supporting substrate. For example, the metal layer 214 comprises Au. Thereby, a bonded structure 1g in which the metal layer 214 is formed on the back surface of the supporting substrate 20 via the adhesion layer 212.

Subsequently, alloying process (alloy process) is performed on the bonded structure 1g, thereby progressing alloying reaction between the metal layer 214 and the supporting substrate 20. In this preferred embodiment, before the alloy process, a Ti layer having an extremely small thickness is formed as the adhesion layer 212, alternatively the adhesion layer 212 in which the Ti particle aggregates or the Ti superfine particles are scattered is formed on the back surface of the supporting substrate 20. When the alloy process is carried out on the adhesion layer 212, an aggregation reaction may occur in the adhesion layer 212. When the aggregation reaction occurs, Ti is locally aggregated on the back surface of the supporting substrate 20. As an example, the adhesion layer 212 is formed in the state that the Ti aggregates are scattered at an interval of several micrometers (μm) on the back surface. When the adhesion layer 212 is formed having 50 nm thickness, the interval is a range of 1 micrometers (μm) to 9 micrometers (μm). As described above, the adhesion layer 212 is extremely thin or comprises the scattered Ti, so that the adhesion layer 212 does not prevent the metal layer 214 and the support substrate 20 from alloying reaction.

Figure 10:
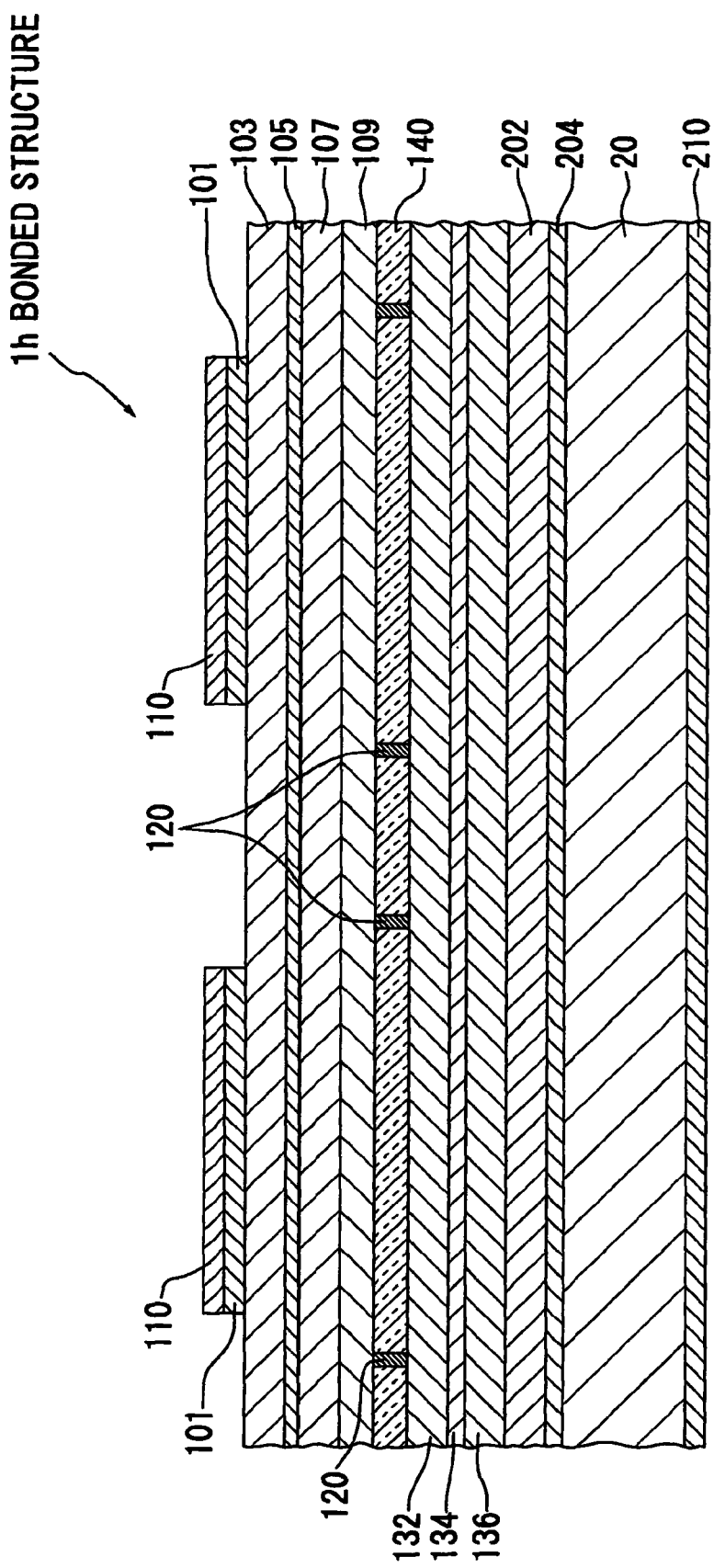
FIG. 10 is a cross sectional view showing the manufacturing process of the light emitting device in the preferred embodiment according to the invention.

For example, the alloy process is carried out on the bonded structure 1g by heating the bonded structure 1g to a temperature of 400° C. in a nitrogen atmosphere as an inert atmosphere, and keeping it at the temperature of 400° C. for five minutes. More concretely, this alloy process may be carried out by installing the bonded structure 1g on a tray of graphite, and introducing the bonded structure 1g installed on the tray into an alloying equipment comprising an upper heater and a lower heater provided independently from the upper heater, and heated to the temperature of 400° C. According to this alloy process, the material composing the metal layer 214 is propagated through the supporting substrate 20, so that the back surface electrode 210 which is an alloy layer made by alloying the metal layer 214 and a part of the supporting substrate 20 is formed on the back surface of the supporting substrate 20, as shown in FIG. 10, thereby providing a bonded structure 1h.

Herein, in the case where the adhesion layer 212 is provided between the supporting substrate 20 and the metal layer 214, the adhesion layer 212 is formed to have the thickness that does not prevent the supporting substrate 20 and the metal layer 214 from the alloy reaction, so that an appropriate alloying reaction occurs between the surface of the supporting substrate 20 and the metal layer 214. In other words, the material composing the metal layer 214 is propagated through the supporting substrate 20 and alloyed with the supporting substrate 20. In this preferred embodiment, the adhesion layer 212 has a function of securing the adhesion between the supporting substrate 20 and the metal layer 214 before the alloy process (i.e. before the alloying between the metal layer 214 and the supporting substrate 20). After finishing the alloy process (i.e. after the alloying between the metal layer 214 and the supporting substrate 20) the adhesion layer 212 serves as an electrode as a part of the back surface electrode 210.

Successively, the pad electrode 115 is formed on a part of the surface of the surface electrode 110, more concretely on the circular electrode by the photo lithography method and the vacuum deposition. For example, the pad electrode 115 is formed by depositing Ti and Au in this order on the surface of the circular electrode of the surface electrode 110. In addition, the alloy process is not carried on the pad electrode 115 for the purpose of securing an enough bonding strength between the surface of the pad electrode 115 and wire for feeding an electric power to the light emitting device 1.

Thereafter, the bonded structure 1h is device-isolated by using a dicing equipment having a dicing blade. In this preferred embodiment, the device-isolation process comprises a half-cut step of cutting the bonded structure 1h from a surface side of the n-type cladding layer 103 to the bottom until a half depth of the bonded structure 1h in a thickness direction, and a full-cut step of completely cutting a part remained in the half-cut step after the half-cut step. Namely, the device is isolated by two stages according to the device-isolation process in this preferred embodiment. At the full-cut step in this preferred embodiment, the back surface electrode 210 including the alloy having a hardness higher than a hardness of Au is cut. Thereby, a plurality of the light emitting devices 1 are formed as shown in FIG. 11.

The light emitting device 1 fabricated by the process shown in FIG. 2A to FIG. 11 is e.g. a light emitting diode (LED) with a configuration of a substantially rectangular with a device size (plane dimensions) of 300 μm×300 μm. Herein, the plane dimensions in the top plan view according to a device design are 320 μm×320 μm. However, the plane dimensions are reduced in length compared with the designed dimensions after passing the half-cut step and the full-cut step due to a blade thickness of the dicing saw of the dicing equipment.

Thereafter, the light emitting device 1 is bonded on a stem such as TO-18 stem by die-bonding with using the electrically conductive material, and the surface electrode 110 and a predetermined region of the TO-18 stem are electrically connected by a wire of e.g. Au. Characteristics of the light emitting device 1 can be evaluated by feeding the electric current from outside to the pad electrode 115 via the wire.

(Variation of the Fabrication Process of the Light Emitting Device 1)

In this preferred embodiment, the alloy process temperature is 400° C. In the variation of this preferred embodiment, however, the alloy process temperature is not limited to this temperature, as long as the alloy reaction effectively progresses between the metal layer 214 an the supporting substrate 20. The upper limit of the alloy process temperature may be 600° C. so as to inhibit the arsenic omission. More preferably, the upper limit of the alloy process temperature may be 500° C. so as to inhibit increasing of a surface contact resistance of the surface electrode 110. The alloy process temperature may be set at lowest 360° C. Furthermore, it is preferable to set the alloy process temperature to be 380° C. or more so as to improve the alloying reaction efficiency.

Effect of the Preferred Embodiment

In the light emitting device 1 in the preferred embodiment, the back surface electrode 210 having the hardness higher than the hardness of Au is formed by the alloying reaction between the supporting substrate 20 and Au, so that it is possible to reduce clogging of diamond abrasives in the diamond blade due to dust of the soft metallic material such as Au during the cutting process using the diamond blade. Namely, it is possible to keep a high cutting force of the diamond blade. Therefore, according to the light emitting device 1 in the preferred embodiment, it is possible to largely reduce the back surface chipping in the device-isolation process. Therefore, it is possible to provide the light emitting device 1 that can be fabricated in high yield.

In addition, according to the light emitting device 1 in the preferred embodiment, Au is formed on the back surface of the supporting substrate 20, and Au is alloyed with the supporting substrate 20, so that the adhesion between the supporting substrate 20 and the back surface electrode 210 is remarkably high, thereby preventing the exfoliation. Therefore, it is possible to provide the light emitting device 1 with high reliability, while the structure of the back surface electrode is significantly simple and convenient and that the fabrication cost is not expensive.

EXAMPLES

Example 1

In the Example 1, a light emitting device having a structure shown in FIG. 1A and FIG. 1B similarly to the light emitting device 1 fabricated by the fabrication process in the preferred embodiment, and having a following structure was manufactured.

At first, the semiconductor multilayer 10 was formed from an n-type contact layer 101 comprising an n-type GaAs, an n-type cladding layer 103 comprising an n-type $(Al_{0.7}Ga_{0.3})_{0.5}In_{0.5}P$, an active layer 105 comprising an undoped $(Al_{0.1}Ga_{0.9})_{0.5}In_{0.5}P$, a p-type cladding layer 107 comprising a p-type $(Al_{0.7}Ga_{0.3})_{0.5}In_{0.5}P$, and a p-type contact layer 109 comprising a p-type GaP. A transparent layer 140 was formed from a $SiO_2$ layer with a thickness of 110 nm. A contact part 120 was formed from AuZn. In addition, a thickness of the contact part 120 is 110 nm similarly to the thickness of the transparent layer 140.

In addition, as a supporting substrate 20, a p-type Si substrate with a resistivity of 0.005 Ω/cm was used. A Ti layer with a thickness of 50 nm was used as a contact electrode 204. A Au layer with a thickness of 500 nm was used as an adhesion layer side bonding layer 202. A Au layer with a thickness of 500 nm was used as a reflecting part side bonding layer 136 of a reflecting part 130. A Pt layer with a thickness of 50 nm was used as a barrier layer 134. An Al layer with a thickness of 400 nm was used as a reflecting layer 132. A width of the contact part 120 was 5 μm. A AuGe layer with a thickness of 50 nm, a Ni layer with a thickness of 10 nm, and a Au layer with a thickness of 300 nm were formed in this order to provide a surface electrode 110. A diameter of a circular electrode of the surface electrode 110 was 100 μm, and a width of a narrow electrode was 10 μm. A Ti layer with a thickness of 30 nm and a Au layer with a thickness of 1000 nm were formed in this order to provide a pad electrode 115. The device size was 300 μm×300 μm in the top plan view.

Furthermore, a back surface electrode 210 was formed by forming a Ti layer with a thickness of 10 nm as an adhesion layer 212 and a Au layer with a thickness of 300 nm as the metal layer 214 in this order, and carrying out the alloy process as described above on these layers. A surface of the metal layer 214 before the alloy process was gold tinged with metallic luster in visual observation. On the other hand, as for the surface of the back surface electrode 210 after the alloy process, the metallic luster thereof was lost in the visual observation, and the color thereof was changed into a color approximated cream. This shows that the metal layer 214 and the supporting substrate 20 were alloyed.

In addition, the device-isolation process was composed of following two-stage isolation process. More concretely, the device-isolation process was carried out by means of two dicing devices. In addition, the bonded structure 1h was attached to a dicing sheet by sticking a side of the back surface electrode 210 on the dicing sheet via an adhesion layer preformed on a surface of the dicing sheet, then put into device-isolation process.

At first, the half-cut step as the first stage of the device-isolation process was performed by using a single-spindle semiautomatic dicing saw (DAD522, a product made by DISCO Corporation) (herein after referred to as "the first dicer") as a dicing device. Herein, NBC-ZH227J-27HCBC (a product made by DISCO Corporation) was used for a diamond blade for the dicing saw. In this diamond blade, a grit (abrasive) diameter was #4000, and a protrusion of blade edge was substantially 0.560 mm, and a blade thickness was about 29 μm. The cutting conditions of the half-cut step were a spindle revolution was 35000 rpm, a feeding speed was 5 mm/sec, and a cutting depth was 100 μm. Since the thickness of the bonded structure 1h was about 210 μm, the bonded structure 1h was cut until about a half depth of the bonded structure 1h.

After finishing the half-cut step, the half-cut bonded structure 1h was detached from the first dicer. The detached bonded structure 1h was set in the second dicer, and the full-cut step was carried out. As the second dicer, the dicing saw of the same type as the first dicer (i.e. DAD522 of DISCO Corporation) was also used. However, a diamond blade used for the second dicer was NBC-ZH227J-27HCAA (a product made by DISCO Corporation). In this diamond blade, a grit (abrasive) diameter was #4000, and a protrusion of blade edge was substantially 0.450 mm, and a blade thickness was about 19 μm. The cutting conditions of the full-cut step were a spindle revolution was 30000 rpm, a feeding speed was 5 mm/sec, and a cutting depth was 230 μm. Since the thickness of the bonded structure 1h was about 210 μm, the bonded structure 1h was completely cut by adjusting a cutting depth in the dicing sheet to be about 20 μm. According to this process, the light emitting device 1 of 300 μm×300 μm in the top plan view was provided.

Successively, after finishing the device-isolation process, a plurality of the light emitting devices 1 stuck on the dicing sheet was transferred to another sheet, and another sheet was expanded. In other words, another sheet was stuck on a side of the pad electrode 115 of the light emitting devices 1 that is stuck on the adhesion layer of the dicing sheet in the state that the side of the pad electrode 115 was located downwardly. After transferring the light emitting devices 1 to another sheet, another sheet was isotropically pulled to be expanded. Thereafter, a condition of the back surface chipping of the light emitting devices 1 was observed.

As a result, an occurrence frequency of the back surface chipping in plane of the wafer was equal to or less than 1%. Further, an amount of the back surface chipping was extremely small, in which a chipping width was within 10 μm. Since the plane dimensions of the light emitting device 1 was 300 μm×300 μm, a ratio of the back surface chipping amount to an area in the top plan view of the light emitting device 1 was suppressed to around 3%. Herein, a forward voltage of the light emitting device in the Example 1 was around 2.0V, and evaluated as good.

Example 2

A light emitting device in Example 2 has a configuration similar to the configuration of the light emitting device in the Example 1, except that the adhesion layer 212 comprising Ti is removed. Therefore, a detailed explanation of the configuration of the light emitting device in the Example 2 is omitted except difference.

In the Examples 2, twenty one (21) pieces of the bonded structure 1h in which the adhesion layer was not provided were manufactured. During handling of the bonded structure 1g at the time of carrying out the alloy process, the exfoliation of the Au layer as the metal layer 214 occurred in two (2) pieces of sample. In addition, it was confirmed by the visual observation that the back surface electrode 210 after the alloy process was black similarly to the back surface of the Si substrate. Therefore, it is assumed that all Au was diffused into the supporting substrate comprising Si and metalized. It is confirmed that all Au was diffused into the supporting substrate and metalized by the SIMS analysis from the back side of the supporting substrate.

The bonded structure 1i after the alloy process was device-isolated similarly to the Example 1. As a result, the back surface chipping hardly occurred, and the good cutting state was obtained. Then, the light emitting device 1 thus obtained was mounted on a lead frame by using Ag paste, and the forward voltage of the light emitting element 1 was measured. The forward voltage was 2.03V i.e. that was low similarly to the Example 1. Therefore, it was shown that the light emitting element in the Example 2 can be used in practical use. In addition, it is preferable to provide the adhesion layer 212 between the metal layer 214 and the supporting substrate 20, for the purpose of reducing the exfoliation of the metal layer 214 before the alloy process.

Example 3

A light emitting device in Example 3 has a configuration similar to the configuration of the light emitting device in the Example 1, except that the thickness of the Au layer as the metal layer 214 is varied. Therefore, a detailed explanation of the configuration of the light emitting device in the Example 3 is omitted except difference.

TABLE 1 shows occurrence frequency of back surface chipping, maximum width of the back surface chipping, and forward voltage when the thickness of the metal layer 214 (the Au layer) was varied in a range from 10 nm to 500 nm.

TABLE 1

| Thickness of metal layer 214 (Au layer) (nm) | Occurrence frequency of back surface chipping | Maximum width of back surface chipping | Forward voltage (V) |
|---|---|---|---|
| 10 | 1% or less | 10 μm or less | 2.38 |
| 30 | 1% or less | 10 μm or less | 2.03 |
| 50 | 1% or less | 10 μm or less | 2.04 |
| 100 | 1% or less | 10 μm or less | 2.02 |
| 200 | 1% or less | 10 μm or less | 2.04 |
| 500 | 1% or less | 10 μm or less | 2.03 |

As shown in TABLE 1, even in the case where the thickness of the Au layer as the metal layer 214 was varied with in a range from 10 nm to 500 nm, the characteristic of the back surface chipping was good for all cases. However, when the thickness of the Au layer was 10 nm, the forward voltage was high. This result suggests that enough bonding was not formed between the back surface electrode 210 and the supporting substrate 20. It is assumed that the thickness of the Au layer was too thin. Therefore, the thickness of metal layer 214 may be determined to be within the range from 10 nm to 500 nm in view of the back surface chipping. However, it is preferable that the thickness of the metal layer 214 is from about 50 nm to 300 nm for the purpose of improving the forward voltage and suppressing an increase in the fabrication cost due to an increase in amount of Au used for the metal layer 214.

Example 4

A light emitting device in Example 4 has a configuration similar to the configuration of the light emitting device in the Example 1, except that the thickness of the Ti layer as the adhesion layer 212 is varied. Therefore, a detailed explanation of the configuration of the light emitting device in the Example 4 is omitted except difference.

TABLE 2 shows occurrence frequency of back surface chipping, maximum width of the back surface chipping, and forward voltage when the thickness of the adhesion layer 212 (the Ti layer) was varied in a range from 0.5 nm to 400 nm.

TABLE 2

| Thickness of adhesion layer 212 (Ti layer) (nm) | Occurrence frequency of back surface chipping | Maximum width of back surface chipping | Forward voltage (V) |
|---|---|---|---|
| 0.5 | 1% or less | 10 μm or less | 2.04 |
| 5 | 1% or less | 10 μm or less | 2.04 |
| 30 | 1% or less | 10 μm or less | 2.03 |
| 50 | 1% or less | 10 μm or less | 2.03 |
| 75 | 3% | 30 μm | 2.03 |
| 100 | 6% | 48 μm | 2.03 |
| 200 | 10% | 60 μm | 2.04 |
| 400 | 30% | 60 μm | 2.03 |

As shown in TABLE 2, even in the case where the thickness of the Ti layer as the adhesion layer 212 was varied within a range from 0.5 nm to 400 nm, the forward voltage of the light emitting device was low, namely good. However, when the thickness of the Ti layer was 75 nm or more, the occurrence frequency of the back surface chipping was increased and the maximum width of the back surface chipping was increased. After observing the back surface electrode after the alloy process in the light emitting device in which the back surface chipping occurred, regions in which Si as the supporting substrate 20 and Au as the metal layer 214 may not be alloyed were observed in places of the light emitting device comprising the adhesion layer 212 with a thickness of 75 nm and the light emitting device comprising the adhesion layer 212 with a thickness of 100 nm. These regions showed gold tinged with metallic luster even after the alloy process.

Furthermore, in the case where the thickness of the adhesion layer 212 was 200 nm, it was conceived that a substantially half of the back surface of the bonded structure 1h was not alloyed. In the case where the thickness of the adhesion layer 212 was 400 nm, it was conceived that a substantially entire part of the back surface of the bonded structure 1h was not alloyed.

Based on the above result, it is preferable that the thickness of the adhesion layer 212 is within a range from 0.5 nm to 75 nm for the purpose of realizing the appropriate alloying reaction without preventing the Au as the metal layer 214 and the Si as the supporting substrate 20 from the alloying. In addition, it is preferable that the thickness of the adhesion layer 212 is within a range from 10 nm to 30 nm for the purpose of designing the forward voltage to be an appropriate value.

In addition, the alloy process in the Example 4 was carried out in the same condition as the condition of the alloy process explained in the preferred embodiment (under the nitrogen atmosphere at a temperature of 400° C., and kept for five minutes). Herein, the alloying reaction between the metal layer 214 and the supporting substrate 20 may be further progressed compared with the Example 3 by increasing the alloy process temperature and/or the alloy process time. In this case, the thickness of the Ti layer as the adhesion layer 212 may be greater than 75 nm, e.g. about 100 nm.

Example 5

A light emitting device in Example 5 has a configuration similar to the configuration of the light emitting device in the Example 1, except that the resistivity of the Si substrate as the supporting substrate 20 is varied. Therefore, a detailed explanation of the configuration of the light emitting device in the Example 5 is omitted except difference.

TABLE 3 shows occurrence frequency of back surface chipping, maximum width of the back surface chipping, and forward voltage, when the resistivity of the supporting substrate 20 is varied in a range from 0.005Ω·cm to 0.05Ω·cm.

TABLE 3

| Resistivity of supporting substrate (Ω · cm) | Occurrence frequency of back surface chipping | Maximum width of back surface chipping | Forward voltage (V) |
|---|---|---|---|
| 0.05 | 1% or less | 10 μm or less | 2.26 |
| 0.02 | 1% or less | 10 μm or less | 2.18 |
| 0.01 | 1% or less | 10 μm or less | 2.06 |
| 0.008 | 1% or less | 10 μm or less | 2.03 |
| 0.005 | 1% or less | 10 μm or less | 2.03 |

As shown in TABLE 3, the resistivity of the supporting substrate 20 did not affect on the characteristic of the back surface chipping, and the characteristic of the back surface chipping was good regardless with the resistivity value. On the other hand, it was shown that the value of the forward voltage tended to increase when the resistivity of the supporting substrate 20 was greater than 0.01Ω·cm so that the good bonding was not formed between the back surface electrode and the supporting substrate 20.

Based on the above result, it is shown that the forward voltage of the light emitting device tends to increase when the resistivity of the supporting substrate 20 is 0.02Ω·cm or more. Therefore, it is preferable that the resistivity of the supporting substrate 20 is not greater than 0.01Ω·cm.

Example 6

A light emitting device in Example 6 has a configuration similar to the configuration of the light emitting device in the Example 1, except that a Ge substrate is provided as the supporting substrate 20 in place of the Si substrate. Therefore, a detailed explanation of the configuration of the light emitting device in the Example 6 is omitted except difference.

In the light emitting element in the Example 6, good results were obtained as to the occurrence frequency of the back surface chipping, the maximum width of the back surface chipping, and the forward voltage value, similarly to the Example 1.

Variation of the Examples

In the Examples 1 and 2, two single spindle-type semiautomatic dicing saw were used together in the device-isolation process. However, double spindle-type blade dicer may be used. In addition, the diamond blade is not limited to the type used in the Examples, and other type diamond blade may be used.

Although the invention has been described, the invention according to claims is not to be limited by the above-mentioned embodiments and examples. Further, please note that not all combinations of the features described in the embodiments and the examples are not necessary to solve the problem of the invention.

What is claimed is:

1. A light emitting device, comprising:
   a semiconductor multilayer structure having a first semiconductor layer of a first conductivity type, a second semiconductor layer of a second conductivity type different from the first conductivity type, and an active layer sandwiched between the first semiconductor layer and the second semiconductor layer;
   a reflecting layer provided on one surface of the semiconductor multilayer structure, the reflecting layer reflecting a light emitted from the active layer;
   a supporting substrate provided on one surface of the reflecting layer opposite to a surface facing the semiconductor multilayer structure, the supporting substrate supporting the semiconductor multilayer structure via a metal bonding layer, the supporting substrate consisting of Si or Ge;
   a back surface electrode provided on one surface of the supporting substrate opposite to a surface facing the metal bonding layer, the back surface electrode comprising Au alloyed with the supporting substrate, a hardness of the back surface electrode being higher than a hardness of the Au; and
   Ti aggregates provided on the one surface of the supporting substrate opposite to a surface facing the metal bonding layer, the Ti aggregates comprising aggregated Ti particles.

2. The light emitting device according to claim 1, wherein the back surface electrode comprises one of AuSi and AuGe.

3. The light emitting device according to claim 1, further comprising:
   an adhesion layer formed between the supporting substrate and the back surface electrode.

4. A light emitting device, comprising:
   a semiconductor multilayer structure having a first semiconductor layer of a first conductivity type, a second semiconductor layer of a second conductivity type different from the first conductivity type, and an active layer sandwiched between the first semiconductor layer and the second semiconductor layer;
   a reflecting layer provided on one surface of the semiconductor multilayer structure, the reflecting layer reflecting a light emitted from the active layer;
   a supporting substrate provided on one surface of the reflecting layer opposite to a surface facing the semiconductor multilayer structure, the supporting substrate supporting the semiconductor multilayer structure via a metal bonding layer, the supporting substrate comprising Si or Ge;
   a back surface electrode provided on one surface of the supporting substrate opposite to a surface facing the metal bonding layer, the back surface electrode comprising Au alloyed with the supporting substrate, a hardness of the back surface electrode being higher than a hardness of the Au; and
   an adhesion layer provided between the supporting substrate and the back surface electrode, the adhesion layer adhering the supporting substrate with the back surface electrode at least before the alloying of the Au and the supporting substrate, the adhesion layer having a thickness that does not prevent the Au and the supporting substrate from alloying,
   wherein the back surface electrode is formed by alloying the Au propagated through the adhesion layer with the supporting substrate.

5. A light emitting device, comprising:
   a semiconductor multilayer structure having a first semiconductor layer of a first conductivity type, a second semiconductor layer of a second conductivity type different from the first conductivity type, and an active layer sandwiched between the first semiconductor layer and the second semiconductor layer;
   a reflecting layer provided on one surface of the semiconductor multilayer structure, the reflecting layer reflecting a light emitted from the active layer;
   a supporting substrate provided on one surface of the reflecting layer opposite to a surface facing the semiconductor multilayer structure, the supporting substrate supporting the semiconductor multilayer structure via a metal bonding layer, the supporting substrate comprising Si or Ge;
   a back surface electrode provided on one surface of the supporting substrate opposite to a surface facing the metal bonding layer, the back surface electrode comprising Au alloyed with the supporting substrate, a hardness of the back surface electrode being higher than a hardness of the Au; and
   an adhesion layer having a thickness from 0.5 nm to 100 nm.

6. The light emitting device according to claim 5, wherein the adhesion layer is formed between the supporting substrate and the back surface electrode.

7. The light emitting device according to claim 5, wherein the adhesion layer comprises Ti.

8. The light emitting device according to claim 7, wherein the back surface electrode comprises an Au layer with a thickness not greater than 30 nm before the alloying.

9. The light emitting device according to claim 8, wherein the supporting substrate has a resistivity not greater than 0.01Ω·cm.

10. A semiconductor element, comprising:
    a supporting substrate consisting of Si or Ge; and
    a semiconductor multilayer structure comprising stacked III-V group compound semiconductors, wherein one surface of the supporting substrate is bonded to the semiconductor multilayer structure via a bonding layer, and wherein on another surface of the supporting substrate opposite to the one surface on which the bonding layer is disposed, Ti aggregates comprising aggregated Ti particles and a back surface electrode, comprising one of AuSi and AuGe comprising an alloy of Au and the supporting substrate, are formed.

11. The semiconductor element according to claim 10, further comprising:

an adhesion layer formed between the supporting substrate and the back surface electrode.

12. The semiconductor element according to claim 10, wherein semiconductor multilayer structure comprises:

a first semiconductor layer of a first conductivity type;

a second semiconductor layer of a second conductivity type different from the first conductivity type; and an active layer sandwiched between the first semiconductor layer and the second semiconductor layer.

13. The semiconductor element according to claim 10, further comprising:

a reflecting layer formed on one surface of the semiconductor multilayer structure for reflecting a light emitted from the semiconductor multilayer structure.

* * * * *